United States Patent
Okukawa et al.

(10) Patent No.: US 8,195,993 B2
(45) Date of Patent: *__Jun. 5, 2012__

(54) SEMICONDUCTOR INTEGRATED CIRCUIT DEVICE

(75) Inventors: Yuki Okukawa, Kawasaki (JP); Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/178,982

(22) Filed: Jul. 8, 2011

(65) Prior Publication Data

US 2011/0264969 A1 Oct. 27, 2011

Related U.S. Application Data

(63) Continuation of application No. 12/415,448, filed on Mar. 31, 2009, now Pat. No. 8,006,145.

(30) Foreign Application Priority Data

Apr. 16, 2008 (JP) .................................. 2008-106605

(51) Int. Cl.
*G11C 29/00* (2006.01)
(52) U.S. Cl. ...................................................... 714/718
(58) Field of Classification Search .................. 714/718, 714/724, 725; 365/201
See application file for complete search history.

(56) References Cited

U.S. PATENT DOCUMENTS

| | | | |
|---|---|---|---|
| 6,285,597 B2 | 9/2001 | Kawahara et al. | |
| 6,496,418 B2 | 12/2002 | Kawahara et al. | |
| 6,798,701 B2 * | 9/2004 | Yamazaki | 365/189.05 |
| 7,146,549 B2 | 12/2006 | Kanba | |
| 7,222,272 B2 * | 5/2007 | Takazawa et al. | 714/718 |
| 7,426,663 B2 * | 9/2008 | Takazawa et al. | 714/718 |
| 7,903,469 B2 * | 3/2011 | Iwai et al. | 365/185.25 |
| 2004/0042331 A1 | 3/2004 | Ikehashi et al. | |

FOREIGN PATENT DOCUMENTS

JP 2003-344500 12/2003

* cited by examiner

*Primary Examiner* — Phung M Chung
(74) *Attorney, Agent, or Firm* — Oblon, Spivak, McClelland, Maier & Neustadt, L.L.P.

(57) ABSTRACT

A semiconductor integrated circuit device related to an embodiment of the present invention includes an address register which includes an internal selection circuit connected with a control circuit, a signal generation instruction circuit which instructs the control circuit so that a predetermined internal control signal is generated, a latch circuit, a plurality of which are arranged corresponding to a number of bits of test parameter data, the latch circuit latching test result data which is provided from the data program/read circuit and outputting the test result data to the selection circuit and externally, the control circuit generating an internal control signal which activates the selection circuit at a timing at which a fixed value data of the test parameter data is changed, and the selection circuit controlling a test so that a fixed value data of the test parameter data is changed.

6 Claims, 11 Drawing Sheets

Example 1

Example 2

US 8,195,993 B2

SEMICONDUCTOR INTEGRATED CIRCUIT DEVICE

CROSS REFERENCE TO RELATED APPLICATION

This application is a continuation of and claims the benefit under 35 U.S.C. §120 from U.S. application Ser. No. 12/415,448, filed on Mar. 31, 2009, which claims priority under 35 U.S.C. §119 from Japanese Patent Application No. 2008-106605, filed on Apr. 16, 2008, the entire contents of each of which are incorporated herein by reference.

BACKGROUND OF THE INVENTION

1. Field of the Invention

The present invention is related to a semiconductor integrated circuit device and also to a semiconductor integrated circuit device in which a test by parameters can be performed efficiently.

2. Description of the Related Art

In recent years, a broad range of tests for semiconductor integrated circuit devices before product shipment have been developed together with progress in large scale capacity and high speed while test times are becoming longer.

There are also a broad ranged of testing methods, however, the manufactured semiconductor integrated circuit device is set with a test device (below referred to as a tester), test parameter data are input from the tester and a problem occurs when specific parameters are set in a test which examines data output from the semiconductor integrated circuit device. That is, while the test parameter data are the data formed from a plurality of bits, a problem occurs in the case where, for a certain address, the test parameter data are formed from a bit of a parameter which must be set to an optimal value (below this process is referred to as trimming), and a bit of a parameter with a fixed value. When the bit of a parameter with a fixed value is changed in this type of test parameter data, the bit of a parameter which has already been trimmed for this address is deleted together with the change. As a result, even in the case where a test is performed when only the bit of a parameter with a fixed value of the test parameter data is changed for the same address in which a trimming process has already been performed, it is necessary to repeat the trimming process which increases the time required for testing significantly. Japanese Laid Open Patent 2003-0344500 is used as a reference.

In a test performed using parameters at the time of product shipment, in the case of testing for each address using parameters formed by combining a bit of a parameter which must be trimmed and a bit of a parameter with a fixed value where only the bit of the parameter with a fixed value is changed, the present invention proposes a semiconductor integrated circuit device in which deletion of the bit with the parameter which has been optimally trimmed together with the change of the bit with the parameter with a fixed value for the same address can be prevented, and controlled so that only the bit of a parameter with a fixed value is changed.

BRIEF SUMMARY OF THE INVENTION

According to an aspect of the present invention, a semiconductor integrated circuit device is provided which comprises a plurality of memory cell arrays arranged with a plurality of electrically reprogrammable memory cells, a control circuit which controls the operations of internal circuits, a data program/read circuit which transfers programming data to said plurality of memory cell arrays and which reads out data from said plurality of memory cell arrays, a data input/output circuit which transfers externally input data to the data program/read circuit and which externally outputs data transferred from the data program/read circuit, an address register which includes an internal selection circuit which is connected with the control circuit, the address register transferring externally input address data to the data program/read circuit, a signal generation instruction circuit which receives an externally provided command and instructs the control circuit so that a predetermined internal control signal is generated, and a latch circuit, a plurality of which are arranged corresponding to a number of bits of externally provided test parameter data, one end of the latch circuit being connected to the control circuit, the data input/output circuit and the address register and the other end of the latch circuit being connected to the data program/read circuit, an input of the latch circuit being connected to an output of the selection circuit and an output of the latch circuit being connected to an input of the selection circuit so that the output of the latch circuit is fed back to the selection circuit, the latch circuit latching the test parameter data which are provided via the selection circuit, the latch circuit transferring the test parameter data to the data program/read circuit, the latch circuit latching test result data which is provided from the data program/read circuit and outputting the test result data to the selection circuit and externally, and the control circuit receiving an instruction from the signal generation instruction circuit and generating an internal control signal which activates the selection circuit at a timing at which a fixed value data of said test parameter data is changed and transferring said internal control signal to said selection circuit, and said selection circuit receiving said internal control signal and controlling a test so that a fixed value data of said test parameter data is changed.

According to second aspect of the present invention, a semiconductor integrated circuit device is provided which comprises a plurality of memory cell arrays arranged with a plurality of electrically reprogrammable memory cells, a control circuit which controls the operations of internal circuits, a data program/read circuit which transfers programming data to the plurality of memory cell arrays and which reads out data from the plurality of memory cell arrays, a data input/output circuit which transfers externally input data to the data program/read circuit and which externally outputs data transferred from the data program/read circuit, an address register which includes an internal selection circuit which is connected with the control circuit, the address register transferring externally input address data to the data program/read circuit, a signal generation instruction circuit which receives an externally provided command and instructs the control circuit so that a predetermined internal control signal is generated, and a latch circuit, a plurality of which are arranged corresponding to a number of bits of externally provided test parameter data, one end of the latch circuit being connected to the control circuit, the data input/output circuit and the address register and the other end of the latch circuit being connected to the data program/read circuit, and the control circuit receiving an instruction from the signal generation instruction circuit and generating an internal control signal which addresses the plurality of latch circuits corresponding to predetermined bits of the test parameter data and transferring the internal control signal to the selection circuit, and the selection circuit receiving the internal control signal and controlling a test so that a fixed value data of the test parameter data is changed.

According to third aspect of the present invention, a test method of a semiconductor integrated circuit device is provided which comprises performing a test by inputting first test parameter data for a predetermined address of a semiconductor integrated circuit device to said a semiconductor integrated circuit device from a test device, receiving a test result of said test using said first test parameter data for said address transferred from said semiconductor integrated circuit device and judging in said test device whether a trimming process for each bit of said first test parameter data for said address is complete or not, performing a test by inputting a predetermined command and second test parameter data to said semiconductor integrated circuit device from said test device, receiving a test result of said test using said second test parameter data for said address transferred from said semiconductor integrated circuit device and judging in said test device whether said test using said second test parameter data for said address is complete or not and outputting a first judgment result, judging in said test device whether said address is a final address or not and outputting a second judgment result, and repeating said tests until each of said judgments results ends in a pass.

DETAILED DESCRIPTION OF THE INVENTION

[Circumstances to the Present Invention]

As stated above, in a test of a semiconductor integrated circuit device, a problem arises when testing using a group of parameters consisting of a bit of a parameter which must be trimmed and a bit of a parameter with a fixed value (below, for the purpose of explanation, these parameters are called mixed parameters) for each address. When mixed parameters are set for a certain address and a test is performed, even in the case where the test is performed when only the bit of a parameter with a fixed value is changed for the same address, the bit of a parameter in which a trimming process is completed is also changed and thus it becomes necessary to repeat the trimming process. This is because when parameters are set and a test is performed, the previous parameters are overwritten by the next parameters. Thus, in order to change a bit of a parameter with a fixed value of the mixed parameters, it is necessary to read out a test result which includes a trimming process result (below, referred to as trimming data) from the semiconductor integrated circuit device which has been set in a tester, and store the result in advance in the tester. That is, certain parameters are set and trimming data in which a trimming process is completed is once transferred to the tester and stored. Following test measurement, the bit of the parameter with a fixed value of the next test parameter data is returned to its original state, a logical sum is taken with the stored trimming data and then input to the tester, and the next mixed parameters which are a logical sum of the trimming data are reset in the semiconductor integrated circuit device. However, the operation in which a logical sum of this trimming data and the next mixed data is taken and input to the tester can not be performed automatically by the tester. Therefore, this operation must be performed manually by the test supervisor, requiring considerable work and leads to significant increase in testing time.

Figure 9A:
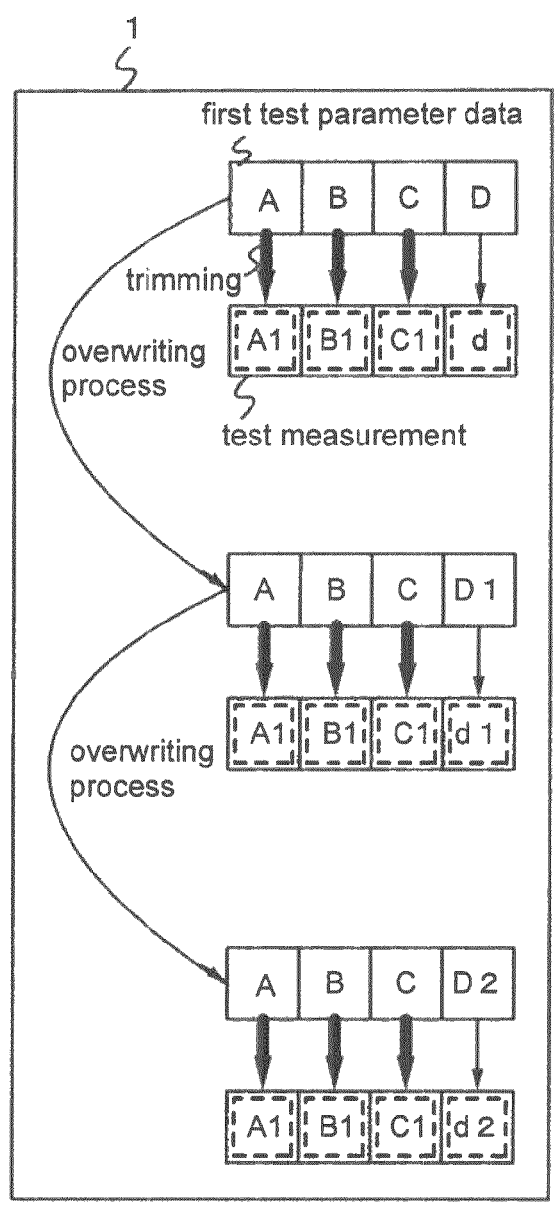
FIG. 9A is a diagram which typically shows the idea of a test method example (Example 1).
Figure 9B:
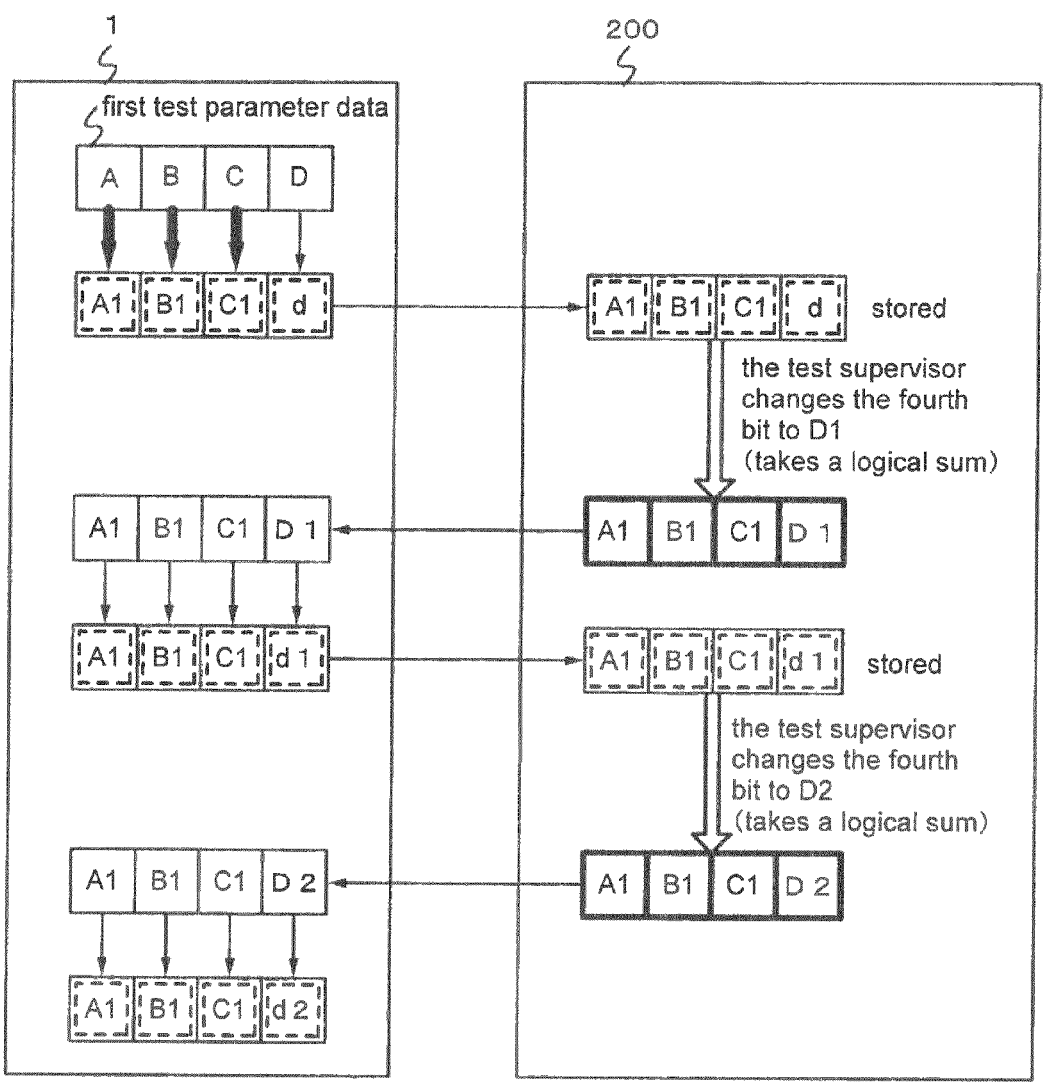
FIG. 9B is a diagram which typically shows the idea of a test method example (Example 2).

Next, an example of an overwrite process will be explained based on the diagrams using a NAND type flash memory as an example. FIG. 9 is a diagram which typically shows the idea of a test method example (example 1 and example 2). The mixed parameters which are used in a test are given as 4 bit parameters, mixed parameters (A, B, C, D). Parameters A, B and C are bits with parameters which require trimming and parameter D is a bit of a parameter with a fixed value for each address. For the purposes of explanation, the results of a trimming process for parameters A, B and C for an address a are given as A1, B1 and C1 respectively.

First, example 1 shown in FIG. 9 will be explained. This example 1 shows an example in which test measurements are performed automatically within the semiconductor integrated circuit device 1 according to a command provided from a tester 200. As is shown in FIG. 9 (A), in a measurement test, mixed parameters (A. B, C, D) are set as test parameter data by a command input from the tester 200 and testing is performed from the address α. Parameters A, B, and C are optimally trimmed for the address α and because the trimming results are A1, B1 and C1 respectively, the test results (A1, B1, C1, d) are obtained which includes the result d of the fixed value D for the address α. In FIG. 9 (A), value enclosed by the dotted line is a test measurement result. The case where a parameter is trimmed is shown by a thick lined arrow in FIG. 9 (A) and a measurement result of a parameter which does not require trimming is shown by a thin lined arrow. The trimming results A1, B1 and C1 for the parameters A, B and C are optimal values of each parameter for the address α, and are effective parameters as along as the address does not change.

Here, as stated above, because these mixed parameters are a group made up of a bit of a parameter which must be trimmed and a bit of a parameter with a fixed value, it is sometimes necessary to perform a test by changing the bit with a fixed value for the same address α. As an example, the case is given where the fixed value D is changed to D1 and further to D2.

As is shown in FIG. 9 (A), in a test measurement, because the mixed parameters are a group but treated as one parameter, after the mixed parameters (A, B, C, D) comes the mixed parameters (A, B, C, D1) and then the mixed parameters (A, B, C, D2) for the same address α. However, at this time, the test parameter data which are provided are overwritten. Therefore, the mixed parameters (A, B, C, D1) and the mixed parameters (A, B, C, D2) are each overwritten in sequence and a test is performed with each mixed parameter.

When each test result of the fixed values D1 and D2 is given as d1 and d2, the results which are changed to the fixed values D1, D2, result (A1, B1, C1, d1), result (A1, B1, C1, d2) are obtained as shown in FIG. 9 (A). However, at this time, a test result of a parameter which requires trimming for an address α, despite having already been obtained as A1, B1, C1, every time the mixed parameters are provided in sequence an optimal value is trimmed again for the parameters A, B, C and the same results are obtained. In example 1, it can be seen that in one series of tests a trimming process is performed nine times. In this way, this wasteful trimming process is repeated for the number of times a fixed value is changed and resulting in considerable test time which leads to an increase in product costs.

In order to prevent this wasteful process, the method shown in example 2 in FIG. 9 (B) is suggested. First, the test result of the mixed parameters (A, B, C, D), result (A1, B1, C1, d), is input to the tester 200 and stored in the tester 200. This result (A1, B1, C1, d) includes the trimmed test result, result (A1, B1, C1), of the parameters A, B, C which require trimming for the address α.

Next, the test supervisor changed the bit of the parameter with a fixed value from D to D1. Specifically, based on the stored test result, result (A1, B1, C1, d), and the mixed parameters (A, B, C, D1) which are the parameters to be tested next, the test supervisor manually takes a logical sum and creates the parameters (A1, B1, C1, D1) and inputs this to the tester 200. These parameters are parameters in which the trimming result of the parameters A, B, C which require trimming are reflected, therefore, the parameters A1, B1, C1 become a parameter with a fixed value and parameters which do not require a trimming process.

The parameters which are input are transferred from the tester 200 to the semiconductor integrated circuit device 1. The semiconductor integrated circuit device 1 performs a test measurement based on these parameters and as stated above, these parameters as a result are parameters which do not require another trimming process, a test is performed while avoiding another trimming process, the result (A1, B1, C1, d1) is obtained and is transferred to the tester 200. The tester 200 stores this result, the above stated series of processes is repeated and finally the result (A1, B1, C1, d2) is obtained in the semiconductor integrated circuit device 1.

In this example 2, as is shown in FIG. 9 (B) the trimming process is performed only for the first three times. However, as stated above, the test supervisor manually takes a logical sum of the test result and the next mixed parameters, creates test parameter data which do not require a trimming process and must input this to the tester 200. Because this process can not be performed automatically by the tester 200 the burden placed on the test supervisor increases and in the case where there are multiple fixed values to be changed increases testing time considerably.

Considering these circumstances the present invention proposes a semiconductor integrated circuit device in which a test is performed using parameters at the time of product shipment and using a group of combined parameters consisting of parameters which require a trimming process and a parameter with a fixed value for each address, in the case of performing a test by changing only the parameter with a fixed value, it is possible to control the test so that only the parameter with a fixed value is changed.

[First Embodiment]

Figure 1:
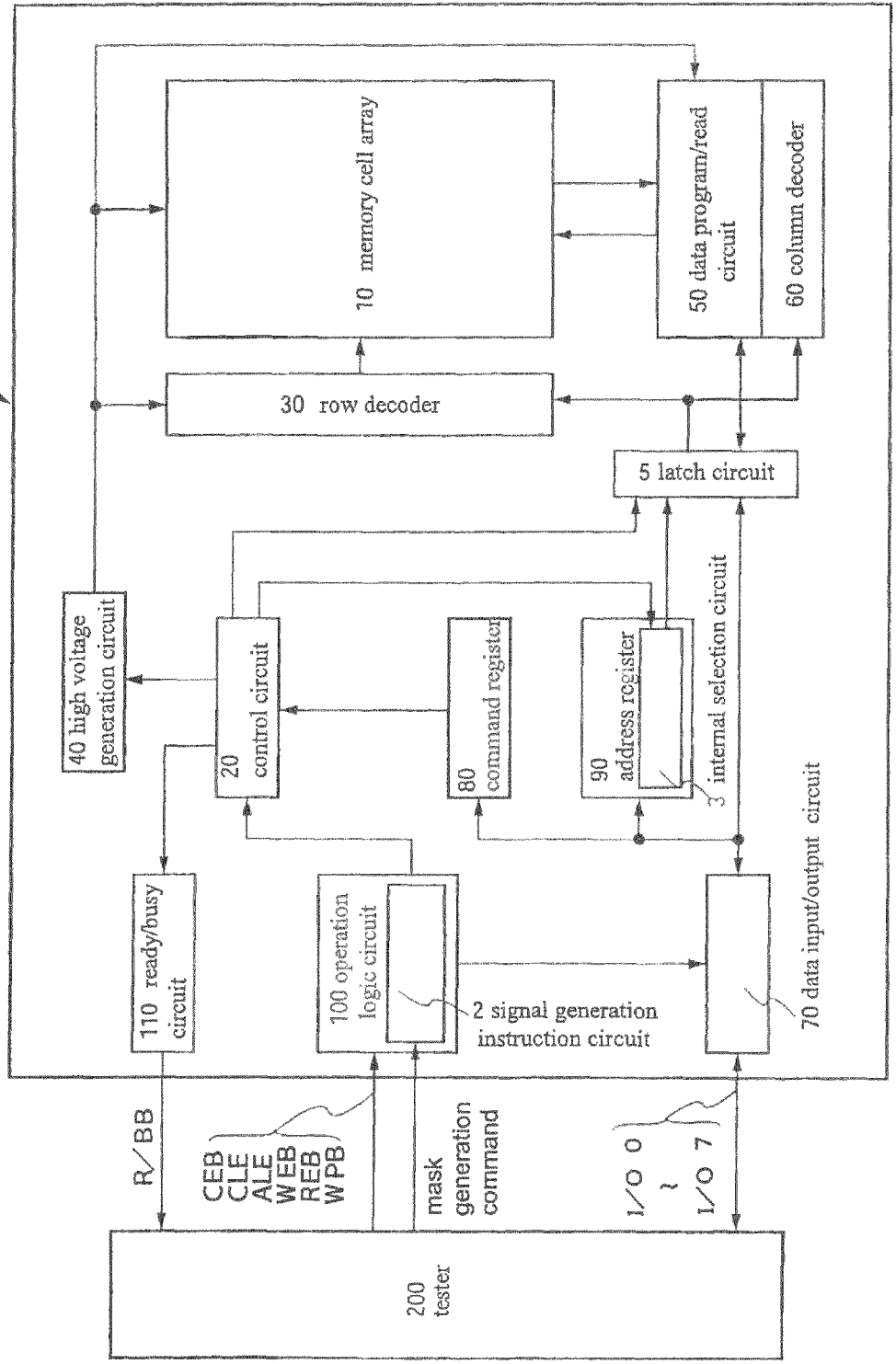
FIG. 1 is an outline construction diagram of the semiconductor integrated circuit device 1 related to an embodiment of the present invention.
Figure 2A:
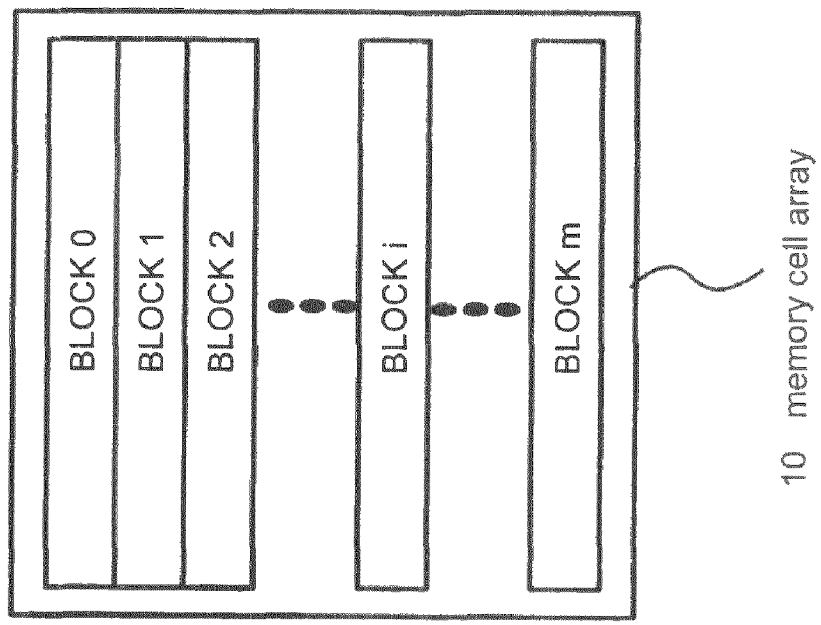
FIG. 2A is an outline construction diagram of a memory cell array 10 of the semiconductor integrated circuit device 1 shown in FIG. 1.
Figure 2B:
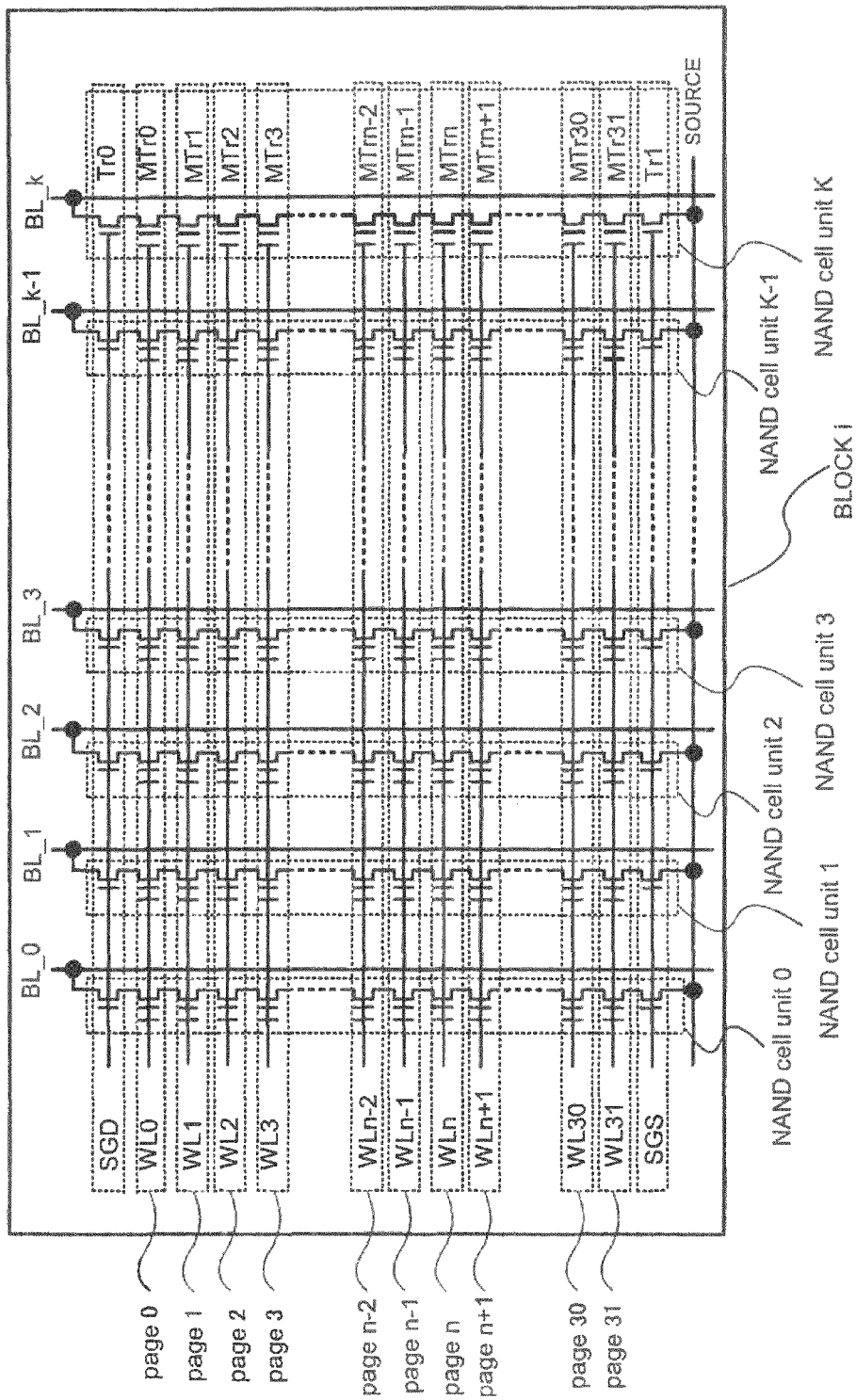
FIG. 2B is an in-block structure diagram of a memory cell array 10 of the semiconductor integrated circuit device 1 shown in FIG. 1.

Below, a semiconductor integrated circuit device related to the first embodiment of the present invention will be explained based on the diagrams. FIG. 1 is an outline construction diagram of a semiconductor integrated circuit device 1 related to the first embodiment of the present invention. FIG. 2 is an outline construction diagram of a memory cell array 10 of the semiconductor integrated circuit device 1 shown in FIG. 1. Furthermore, while the semiconductor integrated circuit device 1 related to the embodiments is explained using a NAND type flash memory as an example, the semiconductor integrated circuit device 1 related to the first embodiment of the present invention is not limited to a NAND type flash memory. Furthermore, in the embodiments, the same symbols are used for the same structural elements and therefore some explanations are omitted to avoid repetition between embodiments.

[Circuit Construction of the Semiconductor Integrated Circuit Device]

The semiconductor integrated circuit device 1 related to the first embodiment of the present invention roughly includes a memory cell array 10, a control circuit 20, a row decoder 30, a high voltage generation circuit 40, a data program/read circuit 50 (below sometimes referred to as a page buffer), a column decoder 60, a data input/output circuit 70 (I/O buffer), a command register 80, an address register 90, an operation logic controller 100 and a ready/busy circuit 110. Of course the semiconductor integrated circuit device 1 related to the first embodiment of the present invention also includes other structural elements, however, an explanation of elements other than those closely related to the present invention is omitted.

The memory cell array 10 includes a plurality of electrically reprogrammable memory cells arranged in a matrix (not shown in the diagram) and the semiconductor integrated circuit device 1 includes a plurality of memory cell arrays 10. The memory cell array 10 is divided into a total of m blocks (BLOCK 0, BLOCK 1, BLOCK 2, ..., BLOCK i, ..., BLOCK m) as is shown in FIG. 2 (A). Here, a BLOCK is the smallest unit of data erasure. Also, each block BLOCK 0-BLOCK m comprises of k NAND cell units 0 to k as is shown in FIG. 2 (B). In the present embodiment, each NAND cell unit comprises of 32 memory cells connected in series and one end is connected to a bit line via a select gate transistor which is connected to a select gate line SGD, and the other end is connected to a common source line via a select gate transistor which is connected to a select gate line SGS. A control gate of each memory cell is connected to a word line. Each of the k memory cells which are connected to one word line store one bit data and these k memory cells are comprised as a unit called a page.

The control circuit 20 receives the output from the operation logic controller 100 and the instructions from the command register 80, and in order to control programming and erase operations, controls the operations of the high voltage generation circuit 40 and controls the generation of a required voltage. In addition, it also controls the operations of the page buffer 50 and the address register 90. Furthermore, the control circuit 20 also controls the operations of the ready/busy circuit 110 which outputs a ready/busy signal for notifying externally (tester 200 in FIG. 1) an access forbid.

The row decoder 30 is connected to a word line (not shown in the diagram) which is connected to a control gate of a memory cell transistor within the memory cell array 10 and is also connected to the address register 90. The row decoder 30 receives address information from the address register 90, selects a memory cell block and supplies a predetermined voltage to a word line of the selected block.

The operations of the high voltage generation circuit 40 are controlled by the control circuit 20. The high voltage generation circuit 40 generates predetermined voltages which are required for the operations of a sense amplifier (not shown in the diagram), the row decoder 30 and the page buffer 50 and supplies each voltage.

The data program/read circuit 50 is connected to the memory cell array 10, the high voltage generation circuit 40 and the column decoder 60. In addition, the data program/read circuit 50 is also connected to the control circuit 20 via a latch circuit 5 described below. The data program/read circuit 50 is internally arranged with one page worth of sense amplifiers (not shown in the diagram) and programming and reading of the memory cell array 10 is performed in page units. In the present embodiment one sense amplifier is connected to one word line, the sense amplifier loads data to a bit line, detects a bit line potential and stores the potential of a bit line in a data cache. Each sense amplifier is controlled by the column decoder 60, reads data from the memory cell array 10, amplifies the data and outputs externally (tester 200 in FIG. 1) via the data input/output circuit 70. Therefore, the data program/read circuit 50 stores data which should be stored in the memory cell array 10 or stores data which is read from this memory cell array 10. That is, the data program/read circuit 50 also doubles as a data latch which stores program data etc.

The column decoder 60 is connected to a sense amplifier. A column gate which selects a column is attached to the sense amplifier. The column decoder 60 receives address information provided from the address register 90 and controls this column gate.

The data input/output circuit 70 (I/O buffer) is connected to an external I/O pad (not shown in the diagram) of the semiconductor integrated circuit device 1. In addition, the data input/output circuit 70 is connected to the command register 80, the address register 90 and the operation logic controller 100. Furthermore, the data input/output circuit 70 is connected with the page buffer 50 via the latch circuit 5. The data input/output circuit 70 is controlled by a control signal supplied from the operation logic controller 100 and supplies commands, addresses and data input externally (tester 200 in FIG. 1) via the I/O pad to the command register 80, address register 90 and page buffer 50 respectively. In addition, at the time of data output, by receiving a control signal from the operation logic controller 100, the data input/output circuit 70 accepts data which is read from the memory cell array 100 and is stored in the page buffer 50 via the latch circuit 5 and the selection circuit 3, then externally outputs the data (to tester 200 in FIG. 1) via the external I/O pad.

The command register 80 is connected to the data input/output circuit 70 and the control circuit 20. The command register 80 imports externally input (tester 200 in FIG. 1) commands which instruct data read, program and erase etc, decodes the commands and provides them to the control circuit 20. The input data is stored in the page buffer 50 via the data input/output circuit 70. Then, this data is programmed to the memory cell array 10 by an instruction of the control circuit 20 which receives a programming command decoded by the command register 80.

The address register 90 includes an internal selection circuit 3 described in detail below. The address register 90 is connected to the control circuit 20 and the data input/output circuit 70. In addition, the address register 90 is also connected to the row decoder 30 and the column decoder 60 via the latch circuit 5. The operations of the address register 90 are controlled by the control circuit 20 and address signals which are externally input (tester 200 in FIG. 1) are received via the data input/output circuit 70 and transferred to the row decoder 30 and the column decoder 60 via the latch circuit 5.

The operation logic controller 100 is connected to the control circuit 20 and the data input/output circuit 70. External control signals such as chip enable signal CEB, command latch enable signal CLE, address latch enable signal ALE, write enable signal WEB, read enable signal REB and write protect signal WPB are input to the operation logic controller 100 and the operation logic controller 100 generates internal control signals according to an operation mode based on the logic of these control signals. Each of these generated internal control signals are transferred to the control circuit 20 and the data input/output circuit 70 become signals which control data program, read and erase by the control circuit 20 and input/output of commands, addresses and data by the data input/output circuit 70.

The ready/busy circuit 110 is connected to the control circuit 20. The ready/busy circuit 110 generates and outputs a ready/busy signal for notifying an access forbid to external devices (tester 200 in FIG. 1) based on an instruction from the control circuit 20.

The semiconductor integrated circuit device 1 related to the first embodiment of the present invention includes a predetermined signal generation instruction circuit 2 within the operation logic controller 100 stated above as shown in FIG. 1. Furthermore, the semiconductor integrated circuit device 1 related to the first embodiment of the present invention includes a plurality of latch circuits 5 just before the data program/read circuit 50. And the semiconductor integrated circuit device 1 related to the first embodiment of the present invention includes a selection circuit 3 within the address register 90.

The signal generation instruction circuit 2 receives a mask generation command from the tester 200, and instructs the control circuit 20 to generate internal control signals according to an operation mode based on the logic of these mask commands. In the present embodiment, when a test is performed by changing only a bit of a parameter with a fixed value of the mixed parameters for each address, the internal control signals generated by the control circuit 20 are signals which control the operation of the selection circuit 3 described below so that only the bit of a parameter with a fixed value is changed without overwriting the parameters which are trimmed once. That is, because they are signals which operate so that bits of parameters which are not be overwritten are masked from the overwriting process, below these internal control signals are referred to as mask signals. In addition, this signal generation instruction circuit 2 is referred to as a mask signal generation instruction circuit 2.

As stated above, the mask signal generation instruction circuit 2 receives a mask generation command provided from the tester 200, generates a predetermined signal and provides this signal to the control circuit 20 and the data input/output circuit 70. However, the example in which the mask signal generation instruction circuit 2 is included within the operation logic controller 100 is only an example and the placement of the mask signal generation instruction circuit 2 is not limited within the operation logic controller 100. For example, the mask signal generation instruction circuit 2 may also be independently arranged between the tester 200 and the operation logic controller 100.

The latch circuit 5 is connected to the control circuit 20 and also connected to the data input/output circuit 70 and the selection circuit 3 which is arranged within the address register 90 described below. A plurality of latch circuits 5 are arranged according to the number of bits of the test parameter data. The plurality of latch circuits 5 are each comprised of a D type flip-flop circuit (sometimes referred to as a DFF circuit below), the test parameter data which are input form the tester 200 are received and stored via the data input/output circuit 70 and the selection circuit 3, and the stored test parameter data are output to the data program/read circuit 50 based on the control signals of the control circuit 20. In addition, the test results are received from the data program/read circuit 50 and stored and the test results are output to the tester 200 via the data input/output circuit 70 based on control signals of the control circuit 20. Furthermore, the placement position of the latch circuit 5 is only an example and not limited to the position described above. For example, the latch circuit 5 may also be arranged within the data program/read circuit 50.

Figure 3:
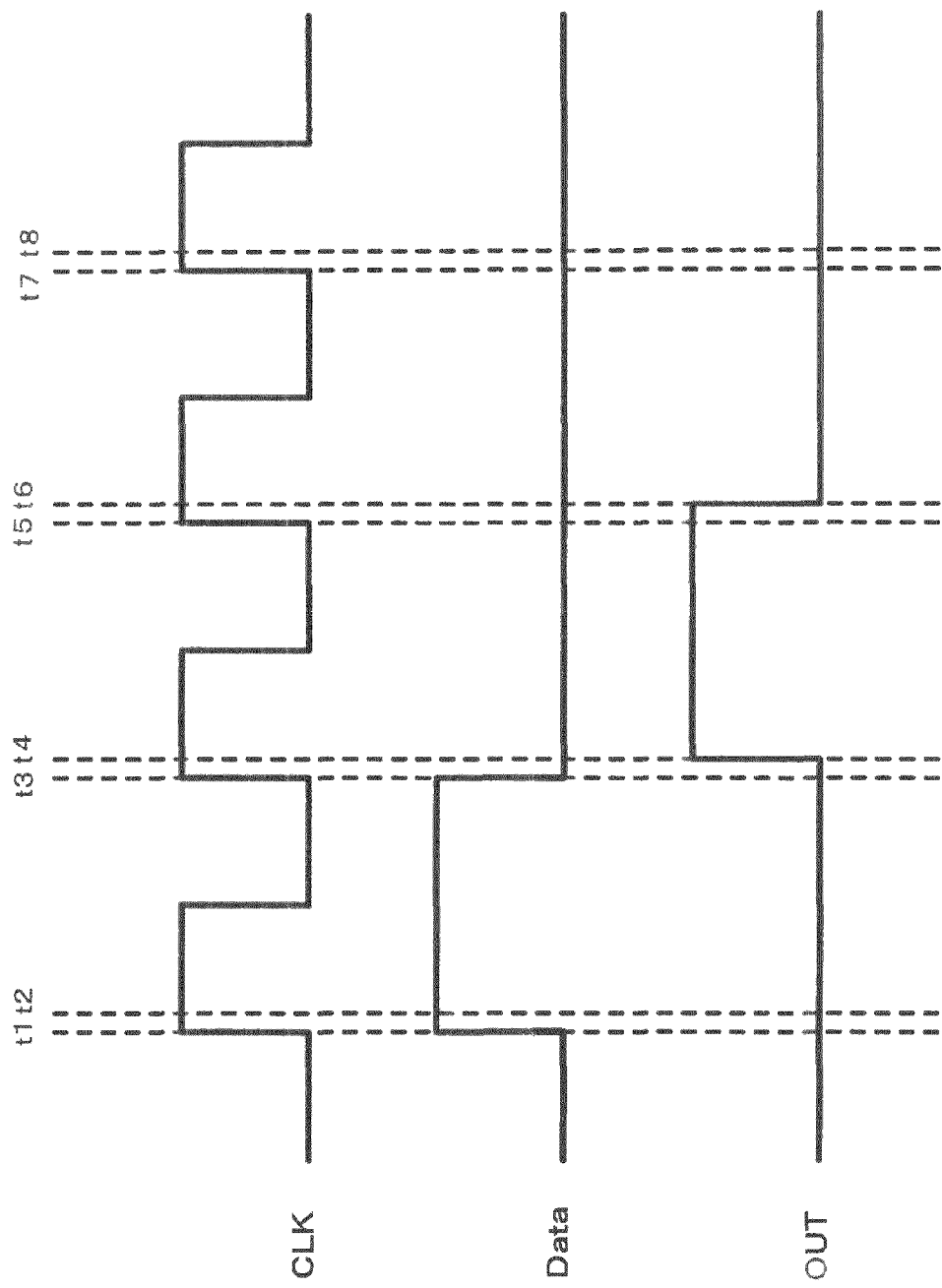
FIG. 3 is timing chart of a DFF circuit which forms a latch circuit 5 of the semiconductor integrated circuit device 1 related to an embodiment of the present invention.

Next, the operations of the latch circuit 5 of the semiconductor integrated circuit device 1 related to the first embodiment of the present invention will be explained. In the present embodiment, because the above stated DFF circuit is used as the latch circuit 5, the DDF will be explained as an example based on the diagrams. FIG. 3 is timing chart of the DFF circuit which forms the latch circuit 5 of the semiconductor integrated circuit device 1 related to the first embodiment of the present invention. The DFF circuit is a circuit in which a clock signal (below referred to as CLK) and data (below written as "Data") are input, input data when the input CLK is changed from a LOW level (below written as "L") to a HIGH level (below written as "H") is transferred to output and output data (below written as "OUT") is output. At all other times, the DFF circuit stores previous output data. That is, the output of the DFF circuit only changes at the initiation edge of CLK (that is, a level shift from a logic "L" to a logic "H"). Therefore, the output of the DFF circuit stores the same value during one cycle of CLK. More precisely, because there is a slight delay within the DFF circuit a slight misalignment occurs between the timing of a change in CLK with the input data and output data.

In FIG. 3, at the timing t1 CLK rises from an "L" level to an "H" level. In addition, "Data" also changes from an "L" level to an "H" level. However, "OUT" at this time is at an "L" level which is the level of "Data" before the CLK rises due to the delay within the DFF circuit stated above. At the timing t2, "OUT" changes according to the rise of CLK, however, because "Data" at the timing t1 when CLK rises is an "L" level, "OUT" is maintained at an "L" level.

At the timing t3 which is the start point of the next cycle of CLK, CLK rises again. At this time, the level of "Data" changes from an "H" level which was the level at t1, to an "L" level. "OUT" receives the rise of CLK and at the timing t4 changes to an "H" level which is the level of data at the timing t3.

At the timing t5 which is the start point of the next cycle of CLK, the level of "Data" is an "L" level. Therefore, at the timing t6, "OUT" changed to an "L" level which is the level of "Data" at the timing t5. Similarly, at the timing t7 which is the start point of the next cycle of CLK, because the level of "Data" is an "L" level, "OUT" is maintained at an "L" level at the timing t8. The above stated operations are the operations of the latch circuit 5. In the operations of the latch circuit 5 as shown above, by controlling timing of the rise of the CLK signal which is provided to the latch circuit 5 and the timing at which "Data" is input it is possible to control latching and output of the data.

The latch circuit 5 of the semiconductor integrated circuit device 1 related to the first embodiment of the present invention receives a test result which includes trimming data which has been trimmed for a certain address from the data program/read circuit 50 and as well as outputting to the external tester 200 provides feedback to the selection circuit 3 within the address register 90. In this way, in addition to the operations of the selection circuit 3 explained below, in the semiconductor integrated circuit device 1 related to the first embodiment of the present invention, it is possible to change only the bit of a parameter with a fixed value without overwriting a bit of a parameter that has been trimmed for a certain address, even in the case where test parameter data are provided in which a bit of a parameter with a fixed value has been changed for the same address.

Furthermore, the semiconductor integrated circuit device 1 related to the first embodiment of the present invention includes the selection circuit 3 within the address register 90 as stated above. The selection circuit 3 is connected with the control circuit 20 and the plurality of latch circuits 5. Then, the operations of the selection circuit 3 are controlled by a mask signal generated by the control circuit 20 based on a signal of a mask signal generation instruction circuit 2 which received a mask generation command input from the tester 200. That is, the selection circuit 3 receives a mask signal and is activated. Furthermore, the placement position of the selection circuit 3 of the present embodiment is only an example and not limited to the position described above. For example, the selection circuit 3 may be independently arranged between the address register 90 and the plurality of latch circuits 5 or changed appropriately.

Based on a mask signal provided from the control circuit 20 the activated selection circuit 3 compares test parameter data (second test parameter data), which are input from the tester 200 via the data input/output circuit 70 and are provided after first test parameter data with previous test parameter data (first test parameter data) which are stored in the plurality of latch circuits 5 and selects the parameters which should be tested next for each bit of a parameter. By this operation, by selecting a trimmed result of a bit of a parameter which has been trimmed to an optimal value for a certain address and selecting a fixed value which has been changed and provided by the next test parameter for a bit of a parameter with a fixed value, the test is controlled so that only the bit of a parameter with a fixed value of the test parameter data is changed. That is, new test parameter data (third test parameter data) which are comprised of parameters which have been trimmed and parameters with a changed fixed value are generated and provided by the selection circuit 3.

Figure 4:
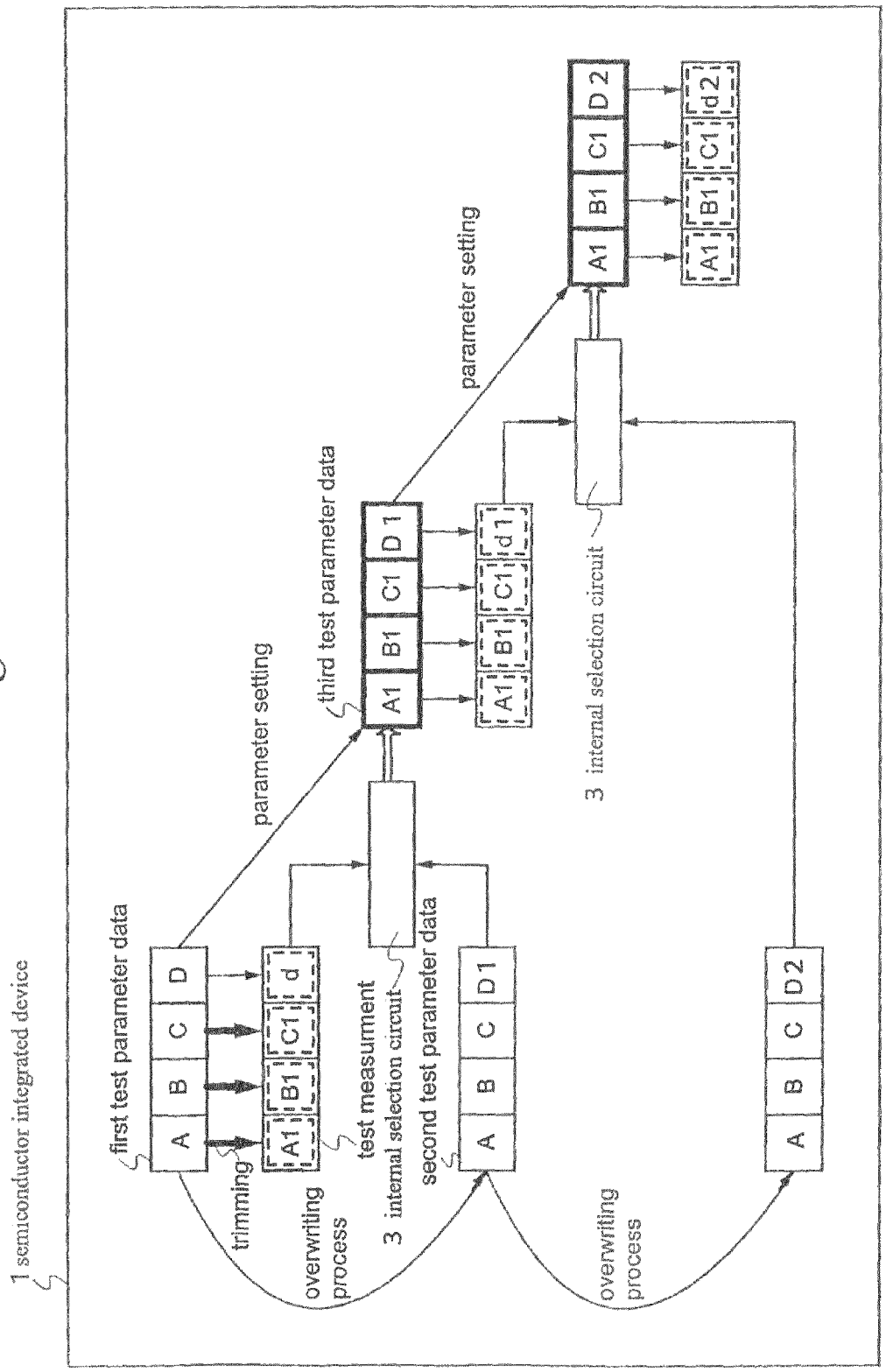
FIG. 4 is a diagram which typically shows the idea of a test performed using parameters of the semiconductor integrated circuit device 1 related to an embodiment of the present invention.

An explanation will be made using the diagrams in order to compare the general idea of the parameters test by the semiconductor integrated circuit device 1 related to the first embodiment of the present invention which includes the above stated circuit structure with the example in FIG. 9 stated above. FIG. 4 is a diagram which typically shows the general idea of a test using parameters of the semiconductor integrated circuit device 1 related to the first embodiment of the present invention. Similar to FIG. 9, the parameters A, B and C are parameters which require trimming and the parameter D is a parameter with a fixed value. The results of the trimming process are given as A1, B1 and C1. The parameter D with a fixed value is changed in sequence to D1 and D2 and the test results of these are given as d, d1 and d2 respectively.

In FIG. 4, first test parameter data (A, B, C, D) are provided to the semiconductor integrated circuit device 1 and a test is performed. Test results (A1, B1, C1, d) which include trimming data which has been trimmed are obtained and stored in the latch circuit 5.

Next, second test parameter data (A, B, C, D1) are provided to the selection circuit 3. At the same time, the test results (A1, B1, C1, d) by the first test parameter data stored in the latch circuit 5 are transferred to the selection circuit 3 from the latch circuit 5. A parameter is selected for every bit of a test parameter by the selection circuit 3 which is activated by a mask signal and third test parameter data (A1, B1, C1, D1) are generated as a result and a test is performed using these test parameter data. That is, the results which are trimmed are reflected and the test parameter which is changed from D to D1 is generated only for the bit of a parameter with a fixed value. In other words, a bit of a parameter which is not to be overwritten is masked and it is possible to prevent erasure together with the change of a parameter with a fixed value.

Figure 5:
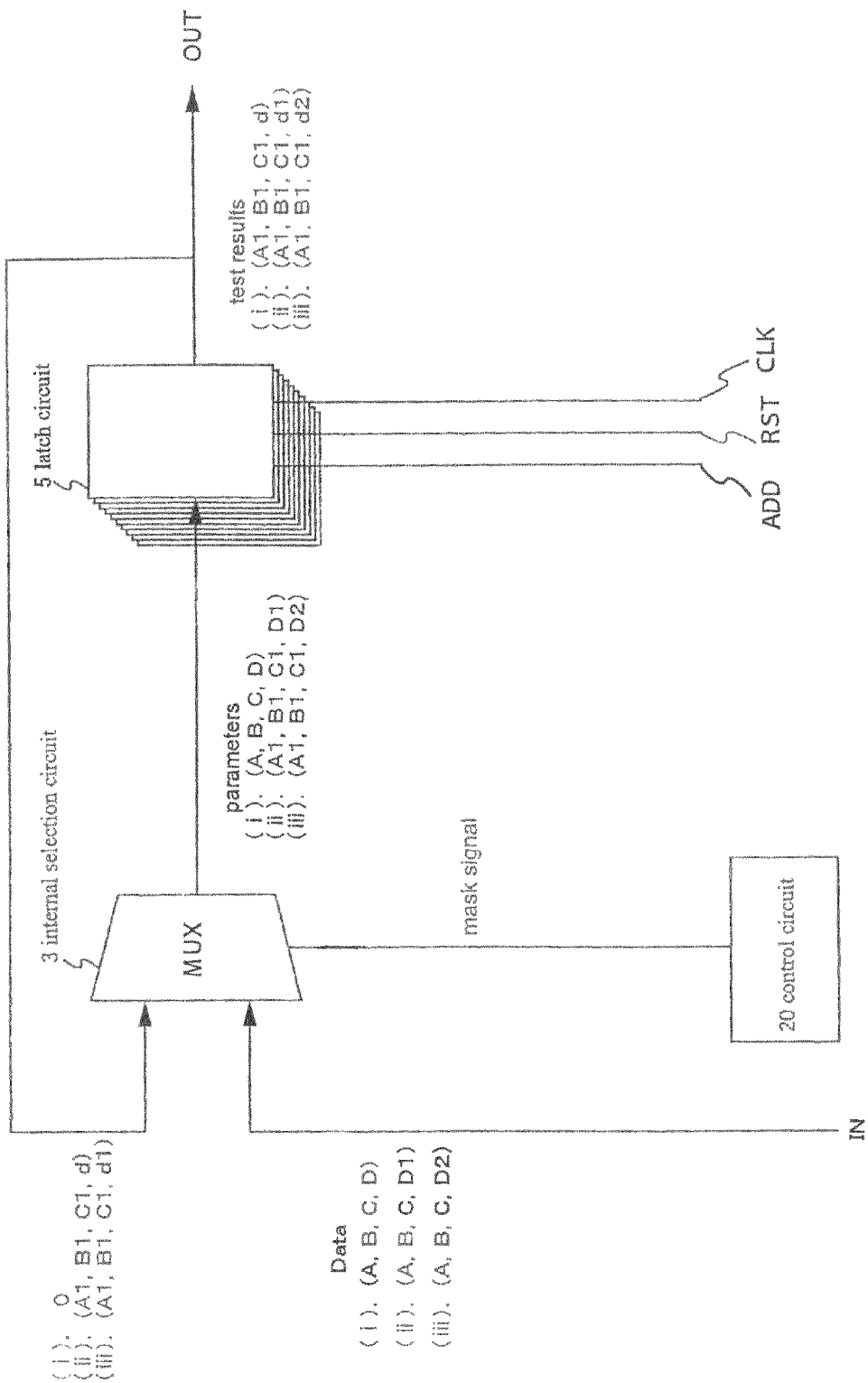
FIG. 5 is a diagram which typically shows the latch circuit 5, a selection circuit 3 and the flow of data between these circuits in the semiconductor integrated circuit device 1 related to an embodiment of the present invention.

The operations of the signal generation instruction circuit 2, the latch circuit 5 and the selection circuit 3 of the semiconductor integrated circuit device 1 related to the first embodiment of the present invention make the test described by the above stated general idea possible. The operations of the signal generation instruction circuit 2 and the latch circuit 5 were explained above. The operations of the selection circuit 3 are described in detail below. In the present embodiment a multiplexer is used as the selection circuit 3. A more detailed explanation will be made based on the diagrams. FIG. 5 is a diagram which typically shows the latch circuit 5, the selection circuit 3 and the flow of data between them of the semiconductor integrated circuit device 1 related to the first embodiment of the present invention. In order to focus on the flow of data, the address register 90 is omitted in FIG. 4.

As is shown in FIG. 5 test parameter data transferred from the tester 200 are input via the data input/output circuit 70 to one input stream of the selection circuit 3 for each address. The output of the latch circuit 5 (that is, a test result, including trimming data, by the test parameter data previously provided) is fed back and input to the other input streams of the selection circuit 3. For each bit of a parameter provided for a certain address the selection circuit 3 compares test result data which is fed back from the latch circuit 5 with the next test parameter data which are provided for this address transferred from the tester 200 via the data input/output circuit 70, selects one of the data and generates test parameter data which are provided next to the latch circuit 5.

A detailed explanation of the flow of data will be made based on FIG. 5. In order to simplify the explanation, according to the example in FIG. 4 stated above, test parameter data are provided and in addition test results are obtained for the address α. The parameters which require trimming are A, B and C. First, the test parameter data "Data" (A, B, C, D) are provided to the selection circuit 3. At this time the selection circuit 3 is in a non-activated state without a mask signal being provided from the control circuit 20. Therefore, a test is performed by these parameters and the test results (A1, B1, C1, d) are obtained. The test results are stored once in the latch circuit 5.

Next, the next test parameter data "Data" (A, B, C, D1) are provided from the tester 200. At this timing, a mask signal from the control circuit 20 is provided to the selection circuit 3, the selection circuit 3 is activated and the test results (A1, B1, C1, d) of the previous parameters stored in the latch circuit 5 are output. The output test results are fed back and input to the selection circuit 3 and also output to the tester 200. Because the selection circuit 3 is activated as stated above, parameters are selected from "Data" (A, B, C, D1) and the results (A1, B1, C1, d) for each bit of a parameter, and the parameters (A1, B1, C1, D1) are provided as the next test parameter data. A test is performed based on these parameters and the results (A1, B1, C1, d1) are obtained.

Next, the next test parameter data "Data" (A, B, C, D2) are provided from the tester 200. At this timing, the test results (A1, B1, C1, d1) of the previous parameters stored in the latch circuit 5 are output. The output test results are fed back and input to the selection circuit 3 and also output to the tester 200. Because the selection circuit 3 is already activated, parameters are selected from "Data" (A, B, C, D2) and the results (A1, B1, C1, d1) for each bit of a parameter and the parameters (A1, B1, C1, D2) are selected as the next test parameter data. A test is performed based on these parameters and the results (A1, B1, C1, d2) are obtained.

As explained above, in the semiconductor integrated circuit device 1 related to the first embodiment of the present invention, in the case where a test is performed when only the parameter with a fixed value is changed by parameters which are combined of parameters which require trimming and parameters with a fixed value for each address at the time of product shipment, it is possible to prevent parameters which are optimally trimmed for this address being erased together with a change in the parameter with a fixed value, and by controlling the test so that only the parameter with a fixed value is changed it is possible to considerably reduce test time at the time of product shipment of the semiconductor integrated circuit device 1. In addition, in this way, the effects whereby it is also possible to achieve a reduction in costs of the semiconductor integrated circuit device 1 are obtained. Furthermore, the effects whereby it is possible to test without affecting the type of tester 200 are also obtained.

[Test Method by a Semiconductor Integrated Circuit Device]

Figure 6:
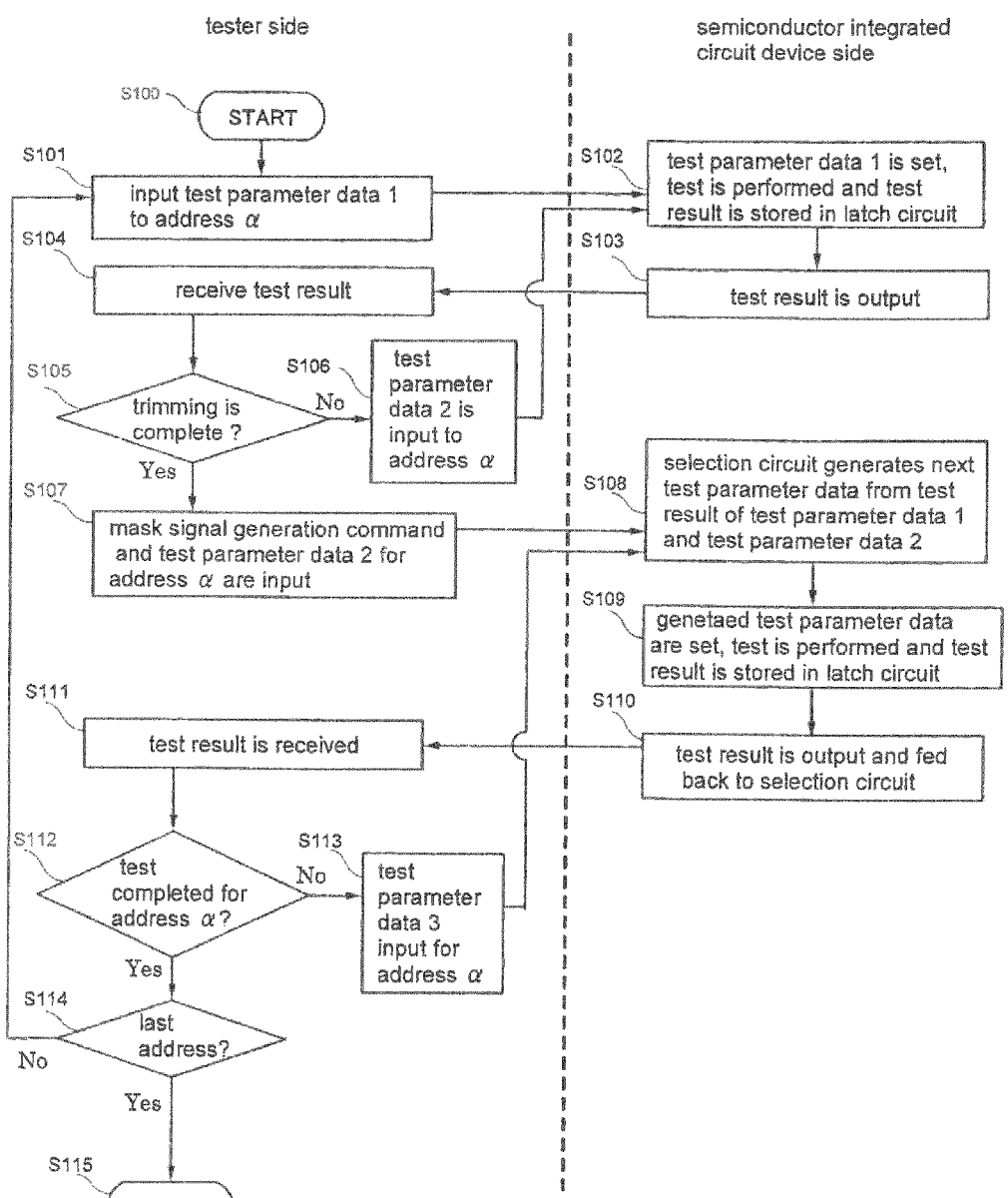
FIG. 6 is a flow chart at the time of a parameter test using a tester 200 of the semiconductor integrated circuit device 1 related to an embodiment of the present invention.

A test method which uses parameters at the time of product shipment in the semiconductor integrated circuit device 1 related to the first embodiment of the present invention with the above stated circuit structure and operation is as follows. The operations of the tester 200 and the semiconductor integrated circuit device 1 will be explained based on FIG. 6. FIG. 6 is a flowchart at the time of a test of the semiconductor integrated circuit device 1 by the tester 200.

First, the test supervisor inputs the test parameter datas which are decided in advance into the tester 200 in address order. Here, the test parameter data are input so that they are provided in order from the test parameter 1 to an address α (step S101). The test parameter data may be automatically input from the tester 200 to the semiconductor integrated circuit device 1 by programming a table and input sequence of the parameters which are input to the semiconductor integrated circuit device 1.

A test parameter 1 for the address α is transferred to the semiconductor integrated circuit device 1, a test is performed and the test result is stored in the latch circuit 5 (step S102).

The latch circuit 5 receives a control signal from the control circuit 20 and outputs the test result of the test parameter 1 which is stored to the tester 200 (step S103).

The test sequence is decided in advance. Therefore, at which timing and to which bit of the parameter the parameters which require trimming are provided is decided in advance. This information is input to the tester 200 at the same time as the input of the test parameter data. Then, the tester 200 is programmed so that it judges whether trimming is completed for each bit of the parameter depending on whether the test result which has been trimmed for the first time has been received or not. The tester 200 which has received the test result judges whether trimming is completed for the bit of the parameter among the test parameter data which requires trimming based on this programming (step S104, S105).

In the case where it is judged that trimming is not complete, a test parameter 2 is input to the address α (step S106), the bit of the parameter with a fixed value of the test parameter data is changed in sequence and input and the steps S102 to S105 are repeated until "YES" is determined in step S105.

In step S105, in the case where "YES" is determined, a mask generation command and the test parameter 2 for the address α are input from the tester 200 to the semiconductor integrated circuit device 1 (step S107).

The control circuit 20 of the semiconductor integrated circuit device 1 receives a signal form the mask signal generation instruction circuit 2 which received the mask generation command, generates a mask signal, transfers it to the selection circuit 3 and the selection circuit 3 is activated. By the control signal of the control circuit 20, the test result by the test parameter 1 stored by the latch circuit 5 is output to the tester 200 and feed back is also provided to the selection circuit 3. The above stated test parameter 2 is compared with the test result by the test parameter 1 which is fed back in the selection circuit 3, and the next test parameter data for each bit of a parameter are generated by the selection circuit 3 (step S108).

The generated test parameter data are set and a test is performed. The test result is output to the tester 200 and also stored by the latch circuit 5 (step S109).

By the control signal of the control circuit 20, a test result by the above stated generated test parameter which was stored by the latch circuit 5 is output to the tester 200 and the feed back is provided to the selection circuit 3 (step S110).

The tester 200 which received the above stated test result determines whether the test is completed for the address α (steps S111 and S112). The tester 200 also determines which address is to be specified for next test parameter data.

In step S112, in the case where "NO" is determined, the next parameters, test parameter data 3, are input for the address α from the tester 200 to the semiconductor integrated circuit device 1 (step S113). The test parameter data are input in sequence for the address α until "YES" is determined in step S112, and the steps S108 to S112 are repeated.

Alternatively, in the case where "YES" is determined in step S112, the tester 200 determines whether this address is the final address to be tested by these parameters (step S114). If "YES" is determined, the test is complete (step S115).

If "NO" is determined in step S114, the address is changed and the steps S101 to S114 are repeated until "YES" is determined in step S114. This is the entire process flow.

As stated above, the semiconductor integrated circuit device 1 related to the first embodiment of the present invention, by performing predetermined programming to the tester 200, the test supervisor, based on the test parameter data provided from the tester 200, can efficiently perform a test without performing any of the processes manually. Also, it is possible to automatically perform a test in which only the bit of a parameter with a fixed value is changed for each address. Here, predetermined programming means determining whether a trimming process is complete for each address which is provided with test parameter data based on an input sequence of test parameter data decided in advance, and at the point where the trimming process is complete programming is performed so that a mask generation command is output from the tester 200 to the semiconductor integrated circuit device 1.

A test method of a semiconductor integrated circuit device is proposed wherein first test parameter data are input to a predetermined address of a semiconductor integrated circuit device from a test device and a test is performed, a test result using these first test parameter data for the address which are transferred from the semiconductor integrated circuit device are received, a judgment is made within the test device whether a trimming process is complete for each bit of the test parameter data for this address, a predetermined command and second test parameter data for the address are input from the test device to the semiconductor integrated circuit device and a test is performed, a test result using these second test parameter data for the address which are transferred from the semiconductor integrated circuit device are received, a judgment is made within the test device whether the test is complete for this address, a judgment is made within the test device whether this address is the final address, and each process is repeated until a pass is determined in each judgment by the semiconductor integrated circuit device 1 and tester 200 related to the first embodiment of the present invention described above.

As explained above, a test method is proposed in which it is not necessary to manually reset a bit of a parameter with a fixed value of test parameter data by the semiconductor integrated circuit device 1 related to the first embodiment of the present invention, and the tester 200. Also, in this way, a test method is proposed in which it is possible to significantly reduce test time.

According to the present invention, a semiconductor integrated circuit device is proposed in which a test using parameters at the time of product shipment is performed and in the case where the test is performed by changing only a bit of a parameter with a fixed value using parameters which are a combination of a bit of a parameter which requires trimming and the bit of a parameter with a fixed value for each address, it is possible to prevent erasing the bit of the parameter which is optimally trimmed for a certain address together with the change of the bit of the parameter with a fixed value and control the test so that only the bit of a parameter with a fixed value is changed.

[Second Embodiment]

Next, another embodiment of the semiconductor integrated circuit device 1 related to the present invention will be explained. The second embodiment of this invention explains further example of the semiconductor integrated circuit device 1 related to the first embodiment of the present invention shown in FIG. 1 in which the multiplexor circuit which forms the selection circuit 3 is replace with an AND circuit. The other structural parts of the semiconductor integrated circuit device 1 apart from the selection circuit 3 are the same as in the first embodiment 1 stated above and therefore an explanation of these parts is omitted here.

The semiconductor integrated circuit device 1 related to the second embodiment of the present invention includes the selection circuit 3 which comprises of an AND circuit and is arranged within the address register 90 shown in FIG. 1. In addition, a mask signal generated by the control circuit 20 is input to the selection circuit 3 by an instruction of the mask signal generation instruction circuit 2 which receives a mask generation command from the tester 200. However, the arrangement position of the selection circuit 3 is not limited to the position described above. The selection circuit 3 may be independently arranged outside of the address register 90.

Figure 7:
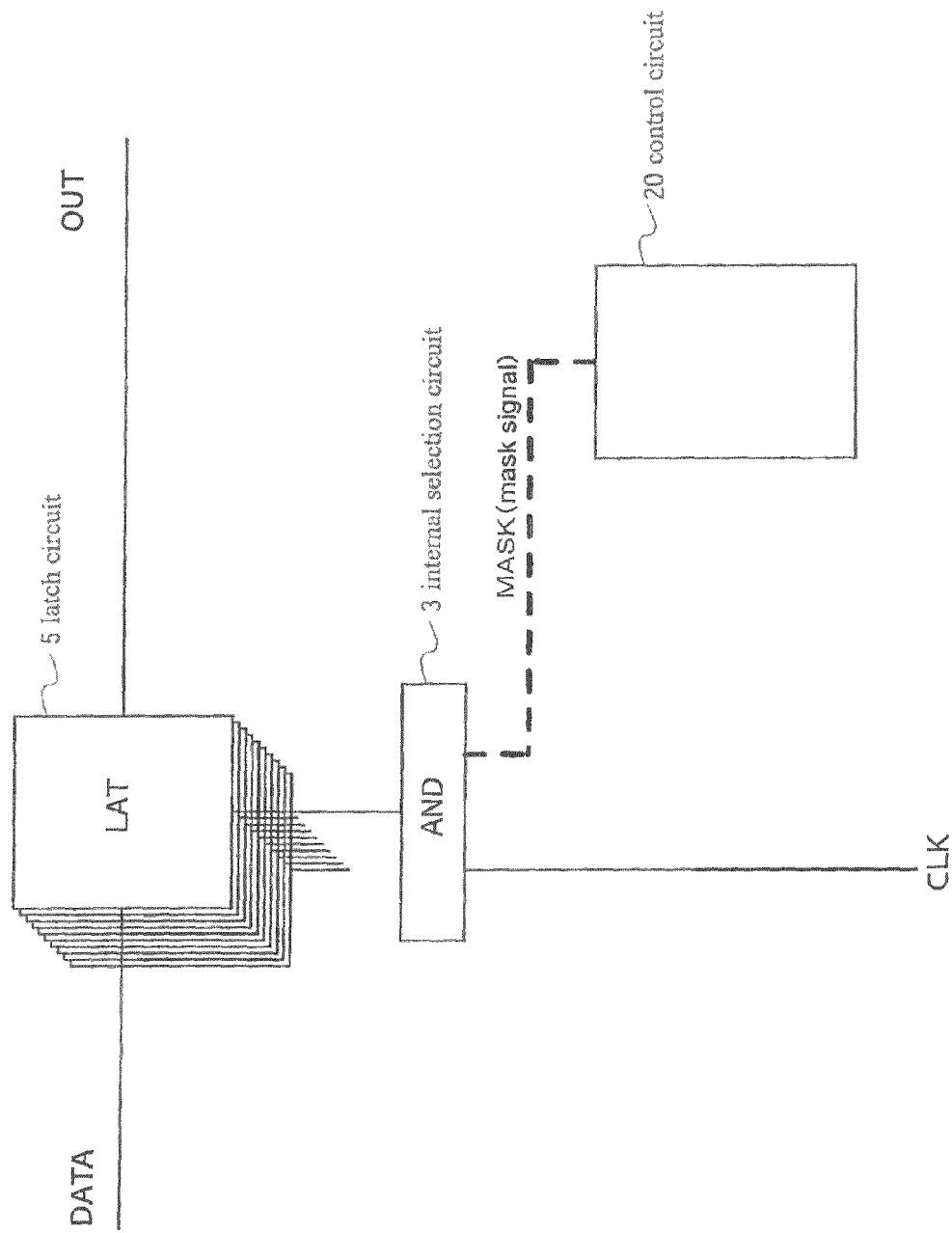
FIG. 7 is an outline diagram which shows an enlarged view of the latch circuit 5 and the selection circuit 3 comprised of an AND circuit in the semiconductor integrated circuit device 1 related to a second embodiment of the present invention.

FIG. 7 is a typical diagram which shows an enlarged view of the selection circuit 3 which comprises of the AND circuit and the latch circuit 5 of the semiconductor integrated circuit device 1 related to the second embodiment of the present invention. For the same reasons as FIG. 4, the address register 90 is omitted from FIG. 7. As is shown in FIG. 7, a mask signal generated by the control circuit 20 is input to one of the inputs (below referred to as input A) of the AND circuit which forms the selection circuit 3 by an instruction of the mask signal generation instruction circuit 2 which receives a mask generation command from the tester 200. Alternatively, a CLK signal is input to the other input (below referred to as input B) of the AND circuit. For example, from the outputs (below referred to as output Y) "1" is output when all the inputs A and B are "1", and "0" is output in all other cases. However, this is merely an example and may be appropriately changed.

As stated above, the latch circuit 5 outputs data which is input at the edge of the rise of the CLK signal and the same data is stored during one cycle of the CLK signal. Therefore, if CLK signal is stopped at a predetermined timing and the rising edge of the CLK signal is controlled so that it does not occur again, the latch circuit 5 continues to store data which is input at the rising edge of the CLK signal just before the CLK signal is stopped and also continues to output the same data. That is, the CLK signal rises once and if the CLK signal is stopped before the CLK signal rises again after the data which is input at rising edge of the CLK signal is stored in the latch circuit 5, the stored data is output regardless of the data which is subsequently input. Therefore, for each bit of a test parameter, if the CLK signal of the latch circuit 5 corresponding to this address is stopped immediately after data which is trimmed is stored in the latch circuit 5, subsequent CLK signals rise again and until different data is stored in the latch circuit 5, the same stored data which is trimmed continues to be output.

Specifically, in step S105 of the test flow shown in FIG. 6 stated above, trimming is performed for a bit of this parameter in step S102 and it is determined from the test result received by the tester 200 that the trimmed data is stored in the latch circuit 5. Then, in step S107, a mask generation command is output from the tester 200 and the control circuit 20 generates a mask signal by an instruction of the mask signal generation instruction circuit 2 which receives this command. The control circuit 20 transfers the mask signal to the latch circuit 5 which corresponds to the bit of the test parameter in which trimming is complete before the rise of the next CLK signal.

Here, the transferred mask signal which is related to the second embodiment, during a predetermined period, that is, during the period in which test parameter data are input to this address after trimming is complete for a bit of test parameter data, is a signal which is controlled so that a "0" level is maintained. Therefore, the selection circuit 3 which is input with this mask signal and the CLK signal continues to output "0" as a CLK signal to the latch circuit 5 during this period despite the CLK signal level and the CLK signal is in a stopped state.

By performing this control, overwriting is not performed of the bit of a parameter which is trimmed until an address is change for every bit of a parameter. In other words, it is possible to change only the bit with a fixed value of the test parameter data. That is, similar to the semiconductor integrated circuit device 1 related to the first embodiment of the present invention, in the semiconductor integrated circuit device 1 related to the second embodiment of the present invention also, a bit of a parameter which is trimmed is not overwritten and it is possible to selectively overwrite and change only the bit of a parameter with a fixed value.

As explained above, in the semiconductor integrated circuit device 1 related to the second embodiment of the present invention, a test using parameters at the time of product shipment is performed and in the case where the test is performed by changing only a bit of a parameter with a fixed value using parameters which are a combination of a bit of a parameter which requires trimming and the bit of a parameter with a fixed value for each address, it is possible to prevent erasing the bit of the parameter which is optimally trimmed for a certain address together with the change of the bit of the parameter with a fixed value and control the test so that only the bit of a parameter with a fixed value is changed and considerably reduce testing time. In addition, in this way, it is possible to reduce manufacturing costs of the semiconductor integrated circuit device 1. Furthermore, it is also possible to perform a test using parameters at the time of product shipment without affecting the type of tester 200.

Furthermore, the selection circuit 3 may be arranged between an address register 90 and a plurality of latch circuits 5, an input terminal may be connected with the address register 90 and control circuit 5, and an output terminal may be connected with each of the plurality of latch circuits 5.

[Third Embodiment]

Next, another embodiment of the semiconductor integrated circuit device 1 related to the present invention will be explained. In the semiconductor integrated circuit device 1 related to the first embodiment of the present invention, a multiplexor was used as an example for the selection circuit 3 and was replaced by an AND circuit in the second embodiment. In the semiconductor integrated circuit device 1 related to the third embodiment of the present invention, an AND circuit is used for the selection circuit 3, as in the second embodiment. However, unlike the second embodiment, an address signal which is input to the latch circuit 5 is stopped for each bit of a test parameter using the selection circuit 3. Because the other circuit structure of the semiconductor integrated circuit device 1 of the third embodiment of the present invention is the same as that of the first embodiment and second embodiment, an explanation is omitted here. In addition, the arrangement position of the selection circuit 3 is not limited to within the address register 90, the same as in the first and second embodiment.

Figure 8:
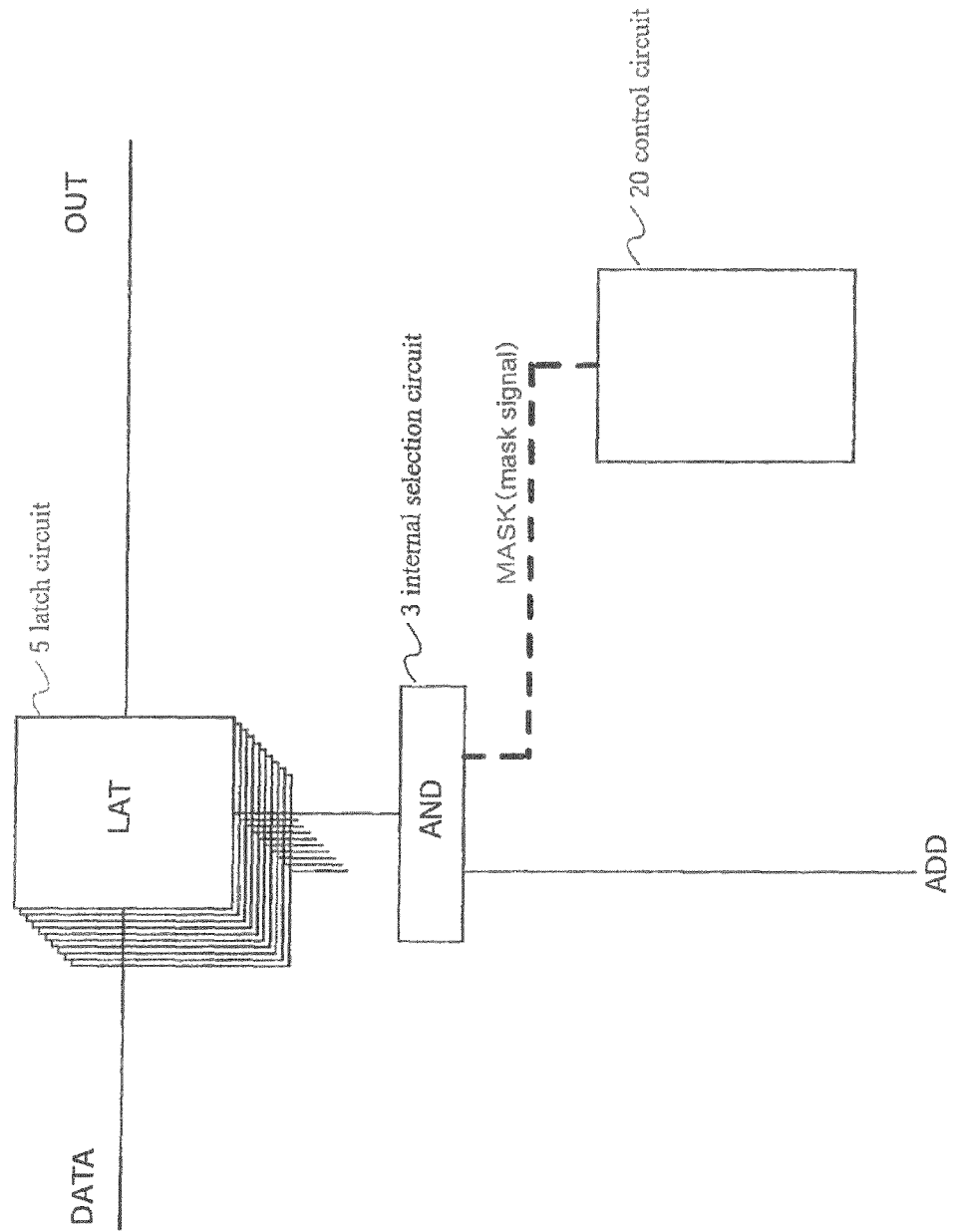
FIG. 8 is an outline diagram which shows an enlarged view of the latch circuit 5 and the selection circuit 3 comprised of an AND circuit in the semiconductor integrated circuit device 1 related to a third embodiment of the present invention.

FIG. 8 is a typical diagram which shows an enlarged view of the selection circuit 3 which comprises of the AND circuit and the latch circuit 5 of the semiconductor integrated circuit device 1 related to the second embodiment of the present invention. In FIG. 8 also, the same as in FIG. 4 and FIG. 6, the address register 90 has been omitted. As is shown in FIG. 8, a mask signal generated by the control circuit 20 is input to one of the inputs (below referred to as input A) of the AND circuit which forms the selection circuit 3 by an instruction of the mask signal generation instruction circuit 2 which receives a mask generation command from the tester 200. Alternatively, an address signal (below referred to as ADD) is input to the other input (below referred to as input B) of the AND circuit. For example, from the outputs (below referred to as output Y) "1" is output when all the inputs A and B are "1", and "0" is output in all other cases. However, this is merely an example and may be appropriately changed.

An address of the semiconductor integrated circuit device 1 is specified and the test parameter data are input from the tester 200. For example, an address α is specified, test parameter data of four bits are input, the next test parameter data in which a bit of a parameter with a fixed value is changed among the test parameter data of the above stated four bits is input to the same address α. That is, the bits of a parameter with a fixed value which is changed is sequentially input to the same address α, and when the input of the parameters to the address α is complete, the address is changed and the same operation is repeated. This address is specified by the ADD signal which is transferred from the external tester 200 via the data input/output circuit 70 to the address register 90, and is transferred from the address register 90 via the latch circuit 5 to the row decoder 30 and the column decoder 60.

As stated above, the latch circuit 5 stores a test result which is input at the rise edge of the CLK signal for each bit of a parameter, and the latch circuit 5 outputs the test result to the tester 200. Therefore, address information is included in the test result which is stored. The test result which includes address information stored in the latch circuit 5 is overwritten by the next test parameter data which are input to the same address. Therefore, by stopping the address information of the next test parameter data which are input, it is possible to avoid overwriting the stored test result by this next address information. That is, in this way, this test result is again provided as test parameter data to an address of a stored test result. This is controlled for each bit of a parameter and an address signal is stopped for a bit of a parameter which is trimmed and an address signal for a bit of a parameter with a fixed value is not stopped. In this way, it is possible to avoid overwriting of a bit of a parameter which is trimmed and change the test parameter data only of a bit of a parameter with a fixed value.

Specifically, in step S105 of the test flow shown in FIG. 6 stated above, trimming is performed in step S102 for the bit of this parameter and it is determined from the test result received by the tester 200 that the data which is trimmed is stored in the latch circuit 5. Then, in step S107, a mask generation command is output from the tester 200 and the control circuit generates a mask signal by an instruction of the mask signal generation instruction circuit 2 which receives this command and the mask signal is transferred to the selection circuit 3 at the same time as the input of the next test parameter data.

Here, the mask signal which is transferred related to the third embodiment, is a signal which performs a control so that a "0" level is maintained during a predetermined period, that is, during a period in which test parameter data are input to this address after a trimming process is complete for a bit of the test parameter data. Therefore, the selection circuit 3 in which this mask signal and the ADD signal are input continues to output "0" as an ADD signal of the latch circuit 5 during this period despite the level of the ADD signal, and the ADD signal is in a stopped state. The latch circuit 5 continues to output test result data in which the stored trimming data is included to this address as test parameter data. Then, as a result, this bit of the test parameter data is not overwritten despite the test parameter data which are input. In other words, the bit of the parameter which is trimmed is masked and it is possible to change only the bit with a fixed value.

As explained above, the semiconductor integrated circuit device 1 related to the third embodiment of this invention, a test using parameters at the time of product shipment is performed and in the case where the test is performed by changing only a bit of a parameter with a fixed value using parameters which are a combination of a bit of a parameter which requires trimming and the bit of a parameter with a fixed value for each address, it is possible to prevent erasing the bit of the parameter which is optimally trimmed for a certain address together with the change of the bit of the parameter with a fixed value and control the test so that only the bit of a parameter with a fixed value is changed and considerably reduce testing time. In addition, in this way, it is also possible to reduce manufacturing costs of the semiconductor integrated circuit device 1. Furthermore, it is also possible to perform a test using parameters at the time of product shipment without affecting the type of tester 200.

Furthermore, a selection circuit 3 may be arranged between an address register 90 and a plurality of latch circuits 5, an input terminal may be connected with an address register 90 and a control circuit 20, and an output terminal may be connected with each of the plurality of latch circuits 5.

Furthermore, it is possible to apply an embodiment of the present invention to a semiconductor memory device which includes a resistance change memory cell array comprised of a plurality of memory cells which are formed using a resistance change material and arranged at the intersection where bit lines and word lines intersect and are alternately separated. Furthermore, it is also possible to apply an embodiment of the present invention to a semiconductor memory device which includes a three dimensional memory array which is formed by stacking this resistance change memory cell array in vertical direction.

What is claimed is
1. A semiconductor integrated device comprising:
a plurality of memory cell arrays arranged with a plurality of electrically reprogrammable memory cells;
a control circuit which controls operation of a latch circuit of a plurality of latch circuits that are arranged corresponding to a number of bits of test parameter data provided from an external tester;
a data input/output circuit which transfers externally input data to said latch circuit of said plurality of latch circuits; and
a selection circuit which is connected with said control circuit,
one end of said latch circuit being connected to said control circuit and said data input/output circuit, an input of said latch circuit being connected to an output of said selection circuit, and an output of said latch circuit being connected to an input of said selection circuit so that the output of said latch circuit is fed back to said selection circuit, said latch circuit latching said test parameter data, which is provided from said external tester via said selection circuit, said latch circuit latching said test parameter data, and which is programmed to said plurality of memory cell arrays and read out from said plurality of memory cell arrays by a data program/read circuit,
said control circuit generating an internal control signal which activates said selection circuit at a timing at which a fixed value data of said test parameter data is changed, and transferring said internal control signal to said selection circuit, and
said selection circuit receiving said internal control signal and controlling so that said fixed value data of said test parameter data is changed by selecting one or more latch circuit of said plurality of latch circuits.

2. The semiconductor integrated device according to claim 1, wherein
said selection circuit is comprised of a multiplexor circuit,
said test parameter data, which is transferred via said data input/output circuit, is input to one input terminal of said selection circuit and output data of said plurality of latch circuits is input to the other input terminal of said selection circuit, and
said selection circuit, which is activated by receiving said internal control signal, generates third test parameter data from second test parameter data provided from said external tester and results of a test using first test parameter data output from said plurality of latch circuits, and transfers said third test parameter data to said plurality of latch circuits.

3. The semiconductor integrated device according to claim 1, further comprising:
an address register, wherein
said selection circuit is arranged between said address register and said plurality of said latch circuits,
an input terminal of said selection circuit is connected with said address register and said control circuit, and
an output terminal of said selection circuit is connected with each of said plurality of said latch circuits respectively.

4. The semiconductor integrated device according to claim 3, wherein
said control circuit generates an internal control signal which addresses said plurality of latch circuits corresponding to predetermined bits of said test parameter data and transfers said internal control signal to said selection circuit, and
said selection circuit receives said internal control signal and controls so that a fixed value data of said test parameter data is changed by selecting one or more latch circuit of said plurality of latch circuits.

5. The semiconductor integrated device according to claim 4, wherein
said selection circuit is comprised of an AND circuit, and
said selection circuit combines said internal control signal and a clock signal which is input to each of said plurality of latch circuits together, transfers said internal control signal and said clock signal to each of said plurality of latch circuits, and controls so that only a bit having said fixed value data of said test parameter data is changed.

6. The semiconductor integrated device according to claim 4, wherein
said selection circuit is comprised of an AND circuit, and
said selection circuit combines said internal control signal and an address signal which is input to each of said plurality of latch circuits together, transfers said internal control signal and said address signal to each of said plurality of latch circuits, and controls so that said fixed value data of said test parameter data is changed.

* * * * *